United States Patent
Wei et al.

(10) Patent No.: US 11,889,739 B2
(45) Date of Patent: Jan. 30, 2024

(54) OLED WITH ELECTRON TRANSPORT LAYER WITHIN INSULATING LAYER

(71) Applicant: Shenzhen China Star Optoelectronics Semiconductor Display Technology Co., Ltd., Shenzhen (CN)

(72) Inventors: Feng Wei, Shenzhen (CN); Aiguo Tu, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 16/622,920

(22) PCT Filed: Nov. 8, 2019

(86) PCT No.: PCT/CN2019/116525
§ 371 (c)(1),
(2) Date: Dec. 16, 2019

(87) PCT Pub. No.: WO2021/082048
PCT Pub. Date: May 6, 2021

(65) Prior Publication Data
US 2022/0416217 A1   Dec. 29, 2022

(30) Foreign Application Priority Data
Oct. 28, 2019  (CN) .......................... 201911032281.8

(51) Int. Cl.
H01L 51/56    (2006.01)
H01L 51/50    (2006.01)
(Continued)

(52) U.S. Cl.
CPC ............. H10K 71/00 (2023.02); H10K 50/15 (2023.02); H10K 50/18 (2023.02); H10K 59/122 (2023.02);
(Continued)

(58) Field of Classification Search
CPC .... H10K 71/00; H10K 59/122; H10K 59/173; H10K 50/18; H10K 50/15; H10K 2102/351
See application file for complete search history.

(56) References Cited

U.S. PATENT DOCUMENTS

2010/0193817 A1   8/2010  Amamiya et al.
2011/0073897 A1*  3/2011  Kang .................. H10K 50/854
                                                    257/98
(Continued)

FOREIGN PATENT DOCUMENTS

CN   101765929 A   6/2010
CN   103681743 A   3/2014
(Continued)

*Primary Examiner* — Peter Bradford
(74) *Attorney, Agent, or Firm* — PV IP PC; Wei Te Chung; Zhigang Ma

(57) ABSTRACT

The present invention provides an organic light-emitting diode (OLED) device and a manufacturing of the OLED device. The OLED device includes a light-emitting layer, an insulating layer, an electron transport layer, and an electron injection layer. The insulating layer is arranged on one side of the light-emitting layer, and a through hole is in the insulating layer. The through hole is arranged corresponding to a middle portion of the light-emitting layer. The electron transport layer is in a lower portion of the through hole and attached to a surface of the light-emitting layer. The electron injection layer is in an upper portion of the through hole and attached to one side of the electron transport layer away from the light-emitting layer.

9 Claims, 2 Drawing Sheets

(51) Int. Cl.
  *H01L 27/32* (2006.01)
  *H10K 71/00* (2023.01)
  *H10K 50/15* (2023.01)
  *H10K 50/18* (2023.01)
  *H10K 59/122* (2023.01)
  *H10K 59/173* (2023.01)
  *H10K 102/00* (2023.01)

(52) U.S. Cl.
  CPC ..... *H10K 59/173* (2023.02); *H10K 2102/351* (2023.02)

(56) References Cited

U.S. PATENT DOCUMENTS

| | | | | |
|---|---|---|---|---|
| 2012/0091482 | A1* | 4/2012 | Uchida | C23C 14/048 438/22 |
| 2012/0261701 | A1* | 10/2012 | Yoo | H10K 50/858 438/22 |
| 2012/0319089 | A1* | 12/2012 | Shin | H10K 71/211 257/E51.024 |
| 2013/0092910 | A1* | 4/2013 | Seo | H10K 85/615 257/E51.026 |
| 2014/0070175 | A1 | 3/2014 | Kang | |
| 2015/0060822 | A1 | 3/2015 | Kamiya et al. | |
| 2016/0247861 | A1* | 8/2016 | Kim | H10K 59/122 |
| 2016/0248035 | A1* | 8/2016 | Hwang | H10K 59/122 |
| 2017/0279049 | A1 | 9/2017 | Dai | |
| 2018/0294412 | A1* | 10/2018 | Cui | H10K 59/173 |
| 2019/0123116 | A1 | 4/2019 | Wang et al. | |
| 2019/0123308 | A1 | 4/2019 | Zheng et al. | |
| 2020/0091249 | A1 | 3/2020 | Liu et al. | |
| 2020/0227494 | A1* | 7/2020 | Bae | H10K 59/124 |

FOREIGN PATENT DOCUMENTS

| | | | |
|---|---|---|---|
| CN | 105774279 A | | 7/2016 |
| CN | 107644951 A | | 1/2018 |
| CN | 107819080 A | | 3/2018 |
| CN | 108539028 A | | 9/2018 |
| CN | 109273621 A | | 1/2019 |
| CN | 110098247 A | | 8/2019 |
| JP | 2010033971 A | * | 2/2010 |
| WO | 2007034900 A1 | | 3/2007 |

* cited by examiner

OLED WITH ELECTRON TRANSPORT LAYER WITHIN INSULATING LAYER

1. FIELD OF DISCLOSURE

The present embodiment relates to a field of display technology and in particular, to an organic light-emitting diode (OLED) device and a manufacturing method thereof.

2. DESCRIPTION OF RELATED ART

Organic light-emitting diode (OLED) displays, also known as organic electroluminescence displays, are a new type of flat-panel display device. OLED devices have been considered as the most promising display device because of advantages such as self-illumination, low driving voltage, high light-emitting efficiency, short response time, high resolution and high contrast ratio, wide viewing angles, a wide operating temperature range, flexible displays, and large-area full color display.

In an active-matrix organic light-emitting diode (AMO-LED) device, an OLED device generally includes a substrate, an anode disposed on the substrate, a hole injection layer (HIL) disposed on the anode, and a hole transport layer (HTL) disposed on the hole injection layer, a light-emitting layer (EML) disposed on the hole transport layer, an electron transport layer (ETL) disposed on the light-emitting layer, and an electron injection layer (EIL) disposed on the electron transport layer, a cathode disposed on the electron injection layer, and a light extraction layer (CAP) disposed on the cathode layer.

At present, manufacturing processes of film layers of the OLED device include vacuum evaporation technology and inkjet printing technology, and both of them have their own advantages and disadvantages. The vacuum evaporation technology has disadvantages of many metal masks and low material utilization. The inkjet printing technology is difficult to make the OLED device to have an even film thickness, so the inkjet printing requires high precision. In addition, a shape of a pixel defining layer (PDL) on an upper surface of the substrate also affects a film thickness of the OLED device. The pixel defining layer is provided with a PDL groove, and the OLED device is disposed in the PDL groove. In a process of inkjet printing the film layers of the OLED device, the film layers are formed in the PDL groove by inkjet printing to produce the OLED device. However, the PDL groove has a certain slope, and a side wall of the PDL groove is uneven, so the PDL groove affects the precision of inkjet printing, and the ink which is inkjet printed on the slope is not evenly distributed, thus resulting in uneven thicknesses of the film layers of the OLED device, and leading to problems such as uneven brightness and current leakage of the OLED device.

SUMMARY

It is an objective of the present embodiment to provide an organic light-emitting diode (OLED) device and a manufacturing method thereof to solve problems that the OLED device has many metal masks and low material utilization rate in a vacuum evaporation process.

It is another objective of the present embodiment to provide the OLED device and a manufacturing method thereof to solve a problem that a shape of a pixel defining layer causes uneven film layers of the OLED device. Such a problem leads to non-uniform brightness and current leakage of the OLED device.

Accordingly, the present embodiment provides an organic light-emitting diode (OLED) device, comprises a light-emitting layer, an insulating layer, an electron transport layer, and an electron injection layer. The insulating layer is disposed on one side of the light-emitting layer, and a through hole is defined in the insulating layer. The through hole is arranged corresponding to a middle portion of the light-emitting layer. The electron transport layer is disposed in a lower portion of the through hole and attached to a surface of the light-emitting layer. The electron injection layer is disposed in an upper portion of the through hole and attached to one side of the electron transport layer away from the light-emitting layer.

The electron transport layer is attached to a bottom and a side wall of the lower portion of the through hole; and the electron injection layer is attached to a surface of the electron transport layer and a side wall of the upper portion of the through hole.

A sum of a thickness of the electron transport layer and a thickness of the electron injection layer is less than or equal to a thickness of the insulating layer.

A thickness of the insulating layer ranges from 11 mm to 35 nm.

A material of the insulating layer comprises a hole transporting material or an electron blocking material.

The OLED device further comprises a substrate, an anode, a hole injection layer, and a hole transport layer. The anode is disposed on one side of the substrate. The hole injection layer is disposed on one side of the anode away from the substrate. The hole transport layer is disposed on one side of the hole injection layer away from the substrate. The light-emitting layer is disposed on one side of the hole transport layer away from the substrate.

The OLED device further comprises a cathode and a light extraction layer. The cathode is disposed on one side of the electron injection layer and one side of the insulating layer away from the substrate. The light extraction layer is disposed on one side of the cathode away from the substrate.

The present invention further provides a manufacturing method of an organic light-emitting diode (OLED) device, comprises following steps:

a light-emitting layer manufacture step: forming a light-emitting layer;

an insulating layer manufacture step: forming an insulating layer on the light-emitting layer, wherein a through hole is defined in the insulating layer, and the through hole is arranged corresponding to a middle portion of the light-emitting layer;

an electron transport layer manufacture step: filling a lower portion of the through hole and forming an electron transport layer, wherein the electron transport layer is attached to an upper surface of the light-emitting layer; and an electron injection layer manufacture step: filling an upper portion of the through hole and forming an electron injection layer, wherein the electron injection layer is attached to an upper surface of the electron transport layer.

In the electron transport layer manufacture step, the electron transport layer is attached to a bottom and a side wall of the lower portion of the through hole; and in the electron injection layer manufacture step, the electron injection layer is attached to a surface of the electron transport layer and a side wall of the upper portion of the through hole.

In the light-emitting layer manufacture step, the light-emitting layer is formed by inkjet printing, and the light-emitting layer is subjected to vacuum drying;

in the insulating layer manufacture step, the insulating layer is formed by evaporation through a metal mask;

in the electron transport layer manufacture step, the electron transport layer is formed by inkjet printing or full evaporation; and in the electron injection layer manufacture step, the electron injection layer is formed by inkjet printing or full evaporation.

Advantages of the present invention: The present embodiment provides an OLED device and a manufacturing method thereof. The OLED device is provided with an insulting layer for printing pixels of films layer of the OLED device. Accordingly, a pixel region is accurately defined, uniform illumination of the OLED device is ensured, current leakage of the OLED device is prevented, and production yields of the OLED device are improved.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DETAILED DESCRIPTION OF EMBODIMENTS

Figure 1:
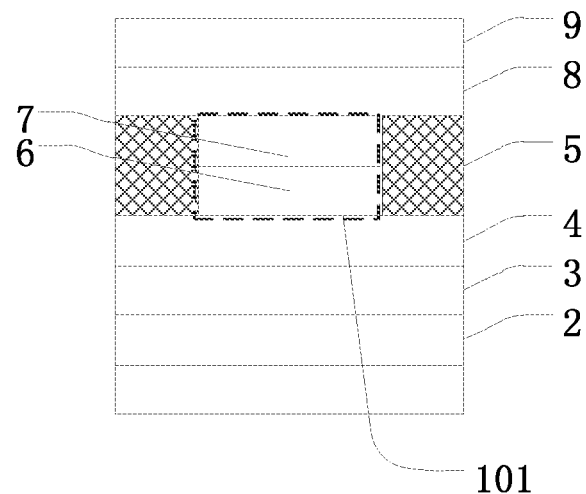
FIG. 1 is a schematic structural view illustrating an OLED device according to one embodiment of the present embodiment.

Example embodiments of the present embodiment are described below with reference to the accompanying drawings, which can fully describe technical contents of the present embodiment to persons of ordinary skills in the art for ease of understanding. However, the present embodiment may be embodied in various forms, and the protection scope of the present embodiment is not limited to the embodiments set forth herein.

A pixel defining layer 100 having protrusions and recessions is disposed on an upper surface of the substrate 10. The pixel defining layer 100 includes a plurality of pixel grooves 110.

The anode 1 is attached on the upper surface of the substrate 10 and disposed in the pixel groove 110. The anode 1 is preferably made of one of indium tin oxide, indium zinc oxide, silver, and aluminum. A thickness of the anode 1 ranges from 50 nm to 200 nm. The anode 1 is patterned on the upper surface of the array substrate 10 by a sputtering film formation process and photolithography.

The hole injection layer 2 is disposed on an upper surface of the anode 1 and is made of ink. A thickness of the hole injection layer 2 ranges from 15 nm to 30 nm. The ink is dropped into OLED pixels by inkjet printing, and then the ink is subjected to vacuum drying to form the hole injection layer 2. The hole transport layer 3 is disposed on an upper surface of the hole injection layer 2 and is made of ink. A thickness of the hole transport layer 3 ranges from 10 nm to 20 nm. The ink is dropped into the OLED pixels by inkjet printing, and then the ink is subjected to vacuum drying to form the hole transport layer 3.

The light-emitting layer 4 is disposed on an upper surface of the hole transport layer 3 and is made of ink. A thickness of the light-emitting layer 4 ranges from 30 nm to 80 nm. Red, green, and blue inks are respectively dropped into the OLED pixels by inkjet printing, and then the light-emitting layer 4 is subjected to vacuum drying to form a red sub-pixel, a green sub-pixel, and a blue sub-pixel, so that a display panel can display images.

The insulating layer 5 is disposed on an upper surface of the light-emitting layer 4, and a through hole 101 is defined in the insulating layer 5. The through hole 101 is arranged corresponding to a middle portion of the light-emitting layer 4. The insulating layer 5 is made of a hole transporting material or an electron blocking material. The hole transporting material and the electron blocking material are organic insulating materials, which can effectively control a light-emitting region and a voltage of the OLED device. The insulating layer 5 is formed by evaporation through a metal mask at an edge of each sub-pixels. A thickness of the insulating layer 5 ranges from 11 mm to 35 nm, and preferably is 20 nm, 25 nm, 28 nm, and 29 nm. In the present embodiment, the insulating layer 5 and the pixel defining layer 100 can be made of the same material if the material can ensure luminous uniformity of the pixels.

The electron transport layer 6 is disposed in a lower portion of the through hole 101 and attached to an upper surface of the light-emitting layer 4. The ink is dropped into the OLED pixels in the lower portion of the through hole 101 by inkjet printing or full evaporation to form the electron transport layer 6 having a thickness ranging from 10 nm to 30 nm.

The electron injection layer 7 is disposed in an upper portion of the through hole 101 and attached to the electron transport layer 6. The ink is dropped into the OLED pixels in the upper portion of the through hole 101 by inkjet printing or full evaporation to form the electron injection layer 7 having a thickness ranging from 1 nm to 5 nm.

The cathode 8 is disposed on upper surfaces of the electron injection layer 7 and the insulating layer 5. Material of the cathode 8 includes, but is not limited to, silver and transparent conductive binary oxide (IZO), and a thickness of the cathode 8 ranges from 10 nm to 20 nm.

The light extraction layer 9 is disposed on an upper surface of the cathode 8. The light extraction layer 9 is made of an organic material, and its thickness ranges from 40 nm to 100 nm. The light extraction layer 9 has a high refractive index, wherein the high refractive index can be 1.77 to 1.85, and luminous efficiency can be 33 cd/A to 41 cd/A, so the light extraction layer 9 is an excellent OLED material.

Figure 2:
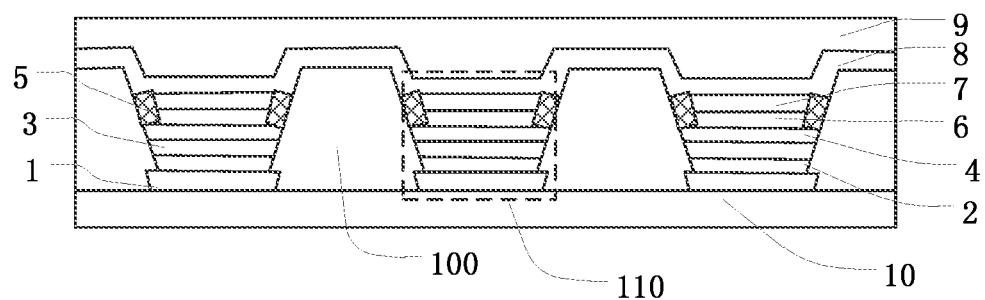
FIG. 2 is a schematic structural view illustrating the OLED device disposed on a substrate according to one embodiment of the present embodiment.

In the present embodiment, a width of the insulating layer 5 is designed according to a pixel structure of the OLED device, the width of the insulating layer 5 generally ranges from 1 μm to 5 μm. A sum of a thickness of the electron transport layer 6 and a thickness of the electron injection layer 7 is less than or equal to a thickness of the insulating layer 5, so that the insulating layer 5 can effectively define the OLED light-emitting pixel. As shown in FIG. 2, two insulating layers 5 are disposed on a side wall of each pixel groove 110. A width of the two insulating layer 5 is less than a width of a bottom of the pixel groove 110. Preferably, the width of the two insulating layer 5 is 3 μm to 10 μm less than the width of the bottom of the pixel groove 110. In the process of printing pixels, the present invention ensures uniformity of the pixels of each film layer of the OLED device and prevents non-uniform distribution of the pixels at edges of each film layer, thereby preventing problems such as short circuits or current leakage of the OLED device.

Compared with conventional techniques, the present provides an OLED device. By providing an insulating layer in the OLED device, the present invention eliminates following problems: A slope of a pixel groove of a pixel defining layer causes uneven thickness of the OLED device's film layers, thereby leading to non-uniform light emission and defects of the device. The insulating layer provided in the OLED device is used to print the pixels of the film layers of the OLED device, so a pixel region can be precisely defined, thereby ensuring uniform light emission of the OLED device, preventing current leakage of the OLED device, and improving production yields of the OLED device.

Figure 3:
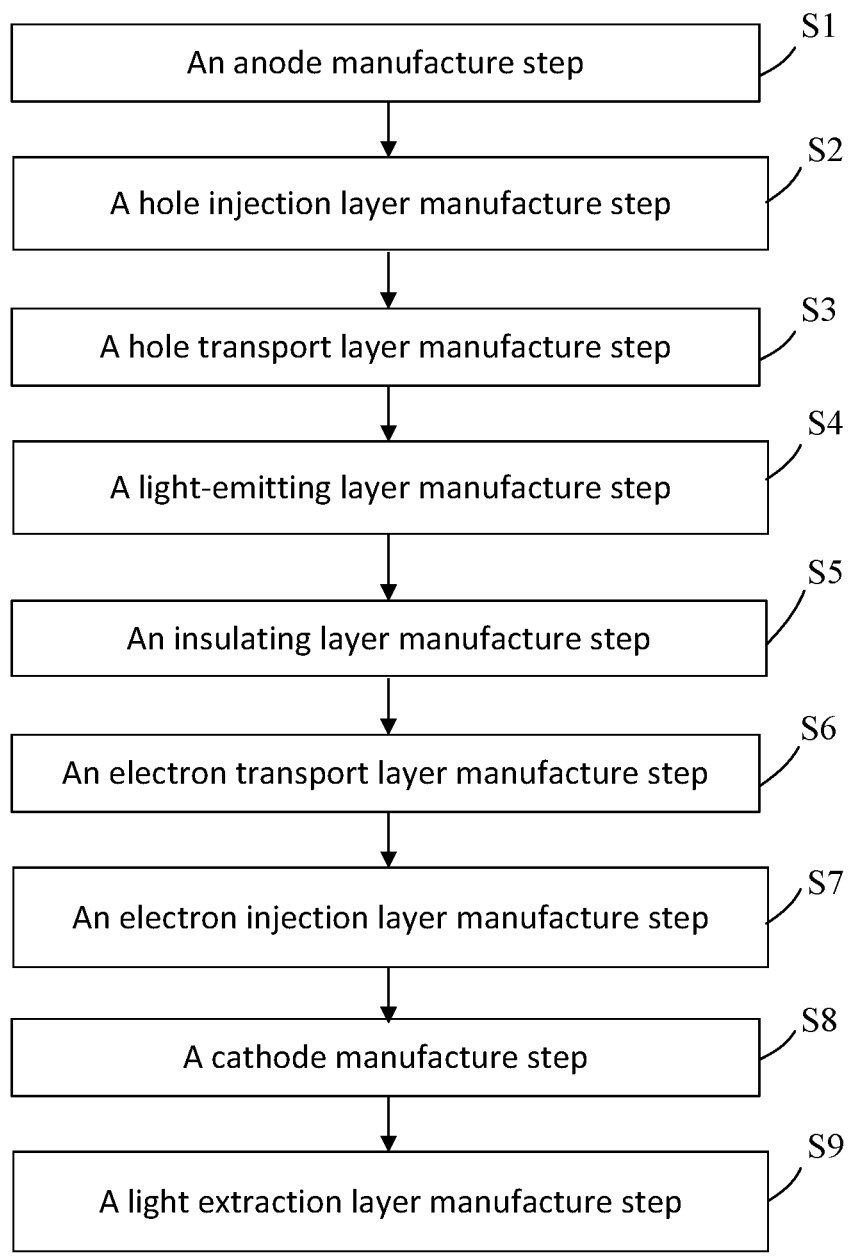
FIG. 3 is a process flow diagram illustrating a manufacturing method of the OLED device according to one embodiment of the present embodiment.

As shown in FIG. 3, the present embodiment further provides a manufacturing method of an organic light-emitting diode (OLED) device. The manufacturing method comprises steps S1 to S9 as follows.

S1) an anode manufacture step: forming an anode 1. Generally, the anode 1 is patterned on an upper surface of a substrate 10 by a sputtering film formation process and a photolithography process. A pixel defining layer 100 having protrusions and recessions is disposed on an upper surface of the substrate 10. The pixel defining layer 100 includes a plurality of pixel grooves 110. The anode 1 is attached on the upper surface of the substrate 10 and disposed in the pixel grooves 110. The anode 1 is preferably made of one of indium tin oxide, indium zinc oxide, silver, and aluminum. A thickness of the anode 1 ranges from 50 nm to 200 nm.

S2) a hole injection layer manufacture step: forming a hole injection layer 2 on an upper surface of the anode 1. In detail, an ink is dropped into the OLED pixels by inkjet printing, and then the ink is subjected to vacuum drying to form the hole injection layer 2. The hole injection layer 2 is made of ink, and a thickness of the hole injection layer 2 ranges from 15 nm to 30 nm.

S3) a hole transport layer manufacture step: forming a hole transport layer 3 on the hole injection layer 2. In detail, an ink is dropped into the OLED pixels by inkjet printing, and then the ink is subjected to vacuum drying to form the hole transport layer 3. The hole transport layer 3 is made of ink, and a thickness of the hole transport layer 3 ranges from 10 nm to 20 nm.

S4) a light-emitting layer manufacture step: forming a light-emitting layer 4. In detail, the light-emitting layer 4 is formed by inkjet printing, and then the light-emitting layer 4 is subjected to vacuum drying.

The light-emitting layer 4 is made of ink, and a thickness of the light-emitting layer 4 ranges from 30 nm to 80 nm. Red, green, and blue inks are respectively dropped into the OLED pixels by inkjet printing, and then the light-emitting layer 4 is subjected to vacuum drying to form a red sub-pixel, a green sub-pixel, and a blue sub-pixel, so that a display panel can display images.

S5) an insulating layer manufacture step: forming an insulating layer 5 on the light-emitting layer 4. A through hole 101 is defined in the insulating layer 5, and the through hole 101 is arranged corresponding to a middle portion of the light-emitting layer 4. In detail, the insulating layer 5 is formed on an upper surface of light-emitting layer 4 by evaporation using a metal mask. The insulating layer 5 is made of a hole transporting material or an electron blocking material. The hole transporting material and the electron blocking material are organic insulating materials, which can effectively control a light-emitting region and a voltage of the OLED device. A thickness of the insulating layer 5 ranges from 11 mm to 35 nm, and preferably is 20 nm, 25 nm, 28 nm, and 29 nm.

S6) an electron transport layer manufacture step: filling a lower portion of the through hole 101 and forming an electron transport layer 6. The electron transport layer 6 is attached to an upper surface of the light-emitting layer 4. The electron transport layer 6 is attached to a bottom and a side wall of the lower portion of the through hole 101. An ink is dropped into the OLED pixels in the lower portion of the through hole 101 by inkjet printing or full evaporation to form the electron transport layer 6 having a thickness ranging from 10 nm to 30 nm.

S7) an electron injection layer manufacture step: filling an upper portion of the through hole 101 and forming an electron injection layer 7. In detail, an ink is dropped into the OLED pixels in the upper portion of the through hole 101 by inkjet printing or full evaporation to form the electron injection layer 7. The electron injection layer 7 is attached to a surface of the electron transport layer 6 and a side wall of the upper portion of through hole 101. The electron injection layer 7 is made of ink or an organic material, and has a thickness ranging from 1 nm to 5 nm.

In the present embodiment, a width of the insulating layer 5 is designed according to a pixel structure of the OLED device, and the width generally ranges from 1 μm to 5 μm. A sum of a thickness of the electron transport layer 6 and a thickness of the electron injection layer 7 is less than or equal to a thickness of the insulating layer 5, so that the insulating layer 5 can effectively define the OLED light-emitting pixel. Two insulating layers 5 are disposed on a side wall of one of the pixel grooves 110. A width of the two insulating layer 5 is less than a width of a bottom of the pixel groove 110. Preferably, the width of the two insulating layer 5 is 3 μm to 10 μm less than the width of the bottom of the pixel groove 110. In the process of printing the pixels, the present invention ensures uniformity of the pixels of film layers of the OLED device, and prevents non-uniform distribution of the pixels at the edges of the film layers, thereby preventing problems such as short circuits or current leakage of the OLED device.

S8) a cathode manufacture step: forming a cathode 8 on upper surfaces of the electron injection layer 7 and the insulating layer 5. Material of the cathode 8 includes, but is not limited to, silver, transparent conductive binary oxide (IZO). A thickness of the cathode 8 ranges from 10 nm to 20 nm.

S9) a light extraction layer manufacture step: forming a light extraction layer 9 on an upper surface of the cathode 8. The light extraction layer 9 is made of an organic material, and its thickness ranges from 40 nm to 100 nm. The light extraction layer 9 has a high refractive index, wherein the high refractive index can be 1.77 to 1.85, and luminous efficiency can be 33 cd/A to 41 cd/A, so the light extraction layer 9 is an excellent OLED material.

The present invention provides a manufacturing method of an OLED device. On the one hand, the OLED device combines inkjet printing and vacuum evaporation to avoid disadvantages of the vacuum evaporation technology or the inkjet printing technology and at the same time reserve their respective technical advantages, thereby simplifying the manufacturing method and allowing mass production. On the other hand, an insulating layer provided in the OLED device is used to print pixels of film layers of the OLED device, so a pixel region is accurately defined, uniform light emission of the OLED device is ensured, current leakage of the OLED device is prevented, and production yields of OLED devices are improved.

The above description only describes preferable embodiments of the present invention. The protection scope of the present invention is not limited to the above description, and those skilled in the art can make various modifications and changes to the above embodiments without departing from the concept and ideas of the present embodiment. All such modifications and changes are deemed to be within the protection scope of the present embodiment.

What is claimed is:

1. An organic light-emitting diode (OLED) device, comprising:
    a light-emitting layer;
    an insulating layer disposed on one side of the light-emitting layer, a through hole extending through the insulating layer, wherein the through hole is arranged corresponding to a middle portion of the light-emitting layer, and a material of the insulating layer comprises a hole transporting material or an electron blocking material;
    an electron transport layer disposed within a lower portion of the through hole and attached to an upper surface of the light-emitting layer; and
    an electron injection layer disposed in an upper portion of the through hole and attached to one side of the electron transport layer away from the light-emitting layer.

2. The OLED device according to claim 1, wherein the electron transport layer is attached to a bottom and a side wall of the lower portion of the through hole; and
    the electron injection layer is attached to a surface of the electron transport layer and a side wall of the upper portion of the through hole.

3. The OLED device according to claim 1, wherein a sum of a thickness of the electron transport layer and a thickness of the electron injection layer is less than or equal to a thickness of the insulating layer.

4. The OLED device according to claim 1, wherein a thickness of the insulating layer ranges from 11 nm to 35 nm.

5. The OLED device according to claim 1, further comprising:
    a substrate;
    an anode disposed on one side of the substrate;
    a hole injection layer disposed on one side of the anode away from the substrate; and
    a hole transport layer disposed on one side of the hole injection layer away from the substrate;
    wherein the light-emitting layer is disposed on one side of the hole transport layer away from the substrate.

6. The OLED device according to claim 1, further comprising:
    a cathode disposed on one side of the electron injection layer and one side of the insulating layer away from the substrate; and
    a light extraction layer disposed on one side of the cathode away from the substrate.

7. A manufacturing method of an organic light-emitting diode (OLED) device, comprising following steps:
    a light-emitting layer manufacture step: forming a light-emitting layer;
    an insulating layer manufacture step: forming an insulating layer on the light-emitting layer, wherein a through hole extends through the insulating layer, the through hole is arranged corresponding to a middle portion of the light-emitting layer, and a material of the insulating layer comprises a hole transporting material or an electron blocking material;
    an electron transport layer manufacture step: forming an electron transport layer by inkjet printing, wherein the electron transport layer fills a lower portion of the through hole, and the electron transport layer is attached to an upper surface of the light-emitting layer; and
    an electron injection layer manufacture step: forming an electron injection layer by inkjet printing, wherein the electron injection layer fills an upper portion of the through hole and is disposed within the upper portion of the through hole, and the electron injection layer is attached to an upper surface of the electron transport layer.

8. The manufacturing method of the OLED device according to claim 7, wherein in the electron transport layer manufacture step, the electron transport layer is attached to a bottom and a side wall of the lower portion of the through hole; and
    in the electron injection layer manufacture step, the electron injection layer is attached to a surface of the electron transport layer and a side wall of the upper portion of the through hole.

9. The manufacturing method of the OLED device according to claim 7, wherein in the light-emitting layer manufacture step, the light-emitting layer is formed by inkjet printing, and the light-emitting layer is subjected to vacuum drying; and in the insulating layer manufacture step, the insulating layer is formed by evaporation through a metal mask.

* * * * *